United States Patent [19]

Rincon et al.

[11] Patent Number: 5,500,625
[45] Date of Patent: Mar. 19, 1996

[54] CONTROLLED CURRENT OUTPUT STAGE AMPLIFIER CIRCUIT AND METHOD

[75] Inventors: Gabriel A. Rincon, Margate, Fla.; Nicolas Salamina; Marco Corsi, both of Dallas, Tex.

[73] Assignee: Texas Instruments Incorporated, Dallas, Tex.

[21] Appl. No.: 348,662

[22] Filed: Dec. 1, 1994

[51] Int. Cl.[6] ................................................ H03F 3/26
[52] U.S. Cl. .................................... 330/273; 330/274
[58] Field of Search ................................. 330/262, 270, 330/273, 274; 327/309

[56] References Cited

U.S. PATENT DOCUMENTS 4,871,977  10/1989  Schilling et al. ............... 330/273 X
5,021,746   6/1991  Huynh ............................ 330/273 X

FOREIGN PATENT DOCUMENTS 0045244   4/1977   Japan ............................. 330/274

OTHER PUBLICATIONS

"Motorola Linear/Interface Devices" *Motorola* pp. 2–232, 2–78, 2–258 and 2–295.

*Primary Examiner*—Steven J. Mottola
*Attorney, Agent, or Firm*—Mark E. Courtney; W. James Brady, III; Richard L. Donaldson

[57] ABSTRACT

An amplifier circuit (10) is provided. The amplifier (10) includes an amplifier stage (14) coupled to an output stage (18). Output stage (18) comprises a sourcing circuit (20) and a sinking circuit (22). The current in sinking circuit (22) is approximately mirrored at low current in mirror circuit (34). At higher currents, resistor (36) maintains the current in mirror circuit (34) below the current in sinking circuit (22). A diode (38) diverts current to mirror circuit (34) to aid sinking circuit (22) in sinking current from a load (12). A current source (29) supplies current to sourcing circuit (20) and mirror circuit (34). A control signal output by amplifier stage (14) causes mirror circuit (34) to draw or not draw current from current source (29). If mirror circuit (34) draws current from current source (29), output stage (18) sinks current in sinking circuit (22). If mirror circuit (34) does not draw current from current source (29), output stage (18) sources current through sourcing circuit (20).

20 Claims, 2 Drawing Sheets

CONTROLLED CURRENT OUTPUT STAGE AMPLIFIER CIRCUIT AND METHOD

CROSS REFERENCE TO RELATED APPLICATIONS

This application is related to the following commonly assigned, co-pending applications: Attorney Docket No. TI-19828, entitled FREQUENCY COMPENSATED CURRENT OUTPUT CIRCUIT WITH INCREASED GAIN, Ser. No. 08/349,234, filed Dec. 5, 1994; and Attorney Docket No. TI-20009, entitled AMPLIFIER CIRCUIT AND METHOD, Ser. No. 08/349,095, filed Dec. 1, 1994.

TECHNICAL FIELD OF THE INVENTION

This invention relates in general to the field of electronic devices. More particularly, the present invention relates to an amplifier circuit and method.

BACKGROUND OF THE INVENTION

Many electronic circuits use amplifiers to manipulate various signals within the circuit. The output of the amplifier may be connected to provide an output voltage to a load circuit. The design of the output stage may affect various operating aspects of the amplifier. For example, some amplifiers can deliver a high output current to the load. Other amplifiers can produce an output voltage swing that is approximately equal to the magnitude of the power supply for the amplifier circuit. Some amplifiers must provide an output that has a low crossover distortion. Yet other amplifiers are required to maintain gain and stability at relatively high frequencies. Each of these requirements places constraints upon the design of the output stage.

During operation, an amplifier circuit consumes current from a power supply. A portion of this current, known as the quiescent current, is used to bias the internal circuitry of the amplifier. A low quiescent current is desirable because it reduces the power consumption when the amplifier is operating at a light load, or with no load at all.

Previously developed amplifier output circuits have addressed some of these problems. For example, output circuits commonly referred as class A circuits provide low output distortion. Unfortunately, class A circuits inherently consume large amounts of quiescent current. A second class of output circuits is referred to as class B circuits. These circuits consume very little quiescent current. However, class B circuits exhibit substantial crossover distortion. A hybrid of the class A and class B output circuits is commonly referred to as class AB output circuits. Class AB circuits consume more quiescent current than equivalent class; B circuits, but less quiescent current than equivalent class A circuits. As a result, they exhibit less crossover distortion than class B circuits but more crossover distortion than class A circuits.

Most amplifiers use class AB output circuits so as to achieve reasonable crossover distortion levels with a quiescent current of perhaps five to ten percent of the maximum allowable output current. These circuits typically have difficulty in achieving significantly lower levels of quiescent current. In addition, many prior amplifier circuits rely upon circuits which reduce the available output swing or the available frequency response to reduce the quiescent current.

SUMMARY OF THE INVENTION

The present invention provides an amplifier circuit and method that eliminates or reduces problems associated with prior circuits and methods. More particularly, in one embodiment, the present invention provides an amplifier circuit that is operable to both source and sink a high current level relative to its bias current. The amplifier circuit has an amplifier stage that is coupled to control an output stage. The output stage includes a circuit for sourcing current to an external load. Additionally, the output stage has a circuit for sinking current from the external load. The sourcing and sinking circuits may comprise emitter follower circuits coupled with a common output node. The output stage also includes a mirror circuit, such as a bipolar junction transistor having a common base with the sinking circuit, coupled to an output of the amplifier stage. Finally, the output stage comprises a current source coupled to both the mirror circuit and the sourcing circuit. The mirror circuit is coupled to mirror the current in the sinking circuit. Based on the output of the amplifier stage, the mirror circuit either draws current from the current source away from the sourcing circuit or prevents the sinking circuit from sinking current by not drawing any current from the current source. Therefore, the current source either causes the sourcing circuit to source an output current to an external load or causes the sinking transistor to sink current from the external load.

According to another aspect of the present invention, the output stage may also include a diode coupled between the common node of the sourcing and sinking circuits and an output to the mirror circuit. In this manner, the diode diverts current to the mirror circuit such that the mirror circuit assists the sinking circuit in sinking current during a sinking operation.

According to another aspect of the present invention, the output stage may also include a clamp circuit coupled to a node between the current source and the mirror circuit. The clamp circuit may prevent a transistor of the mirror circuit from saturating and thus prevent the mirror circuit from interfering with the base current to the transistor in the sinking circuit.

According to another aspect of the present invention, a resistor may be included in the mirror circuit between an emitter of the transistor and the mirror circuit and a ground potential. This resistor controls the rate of increase in current in the mirror circuit relative to the sinking circuit and thus prevents the transistor from drawing excessive current from the clamp circuit, thus increasing the efficiency of the output stage while sinking high currents.

A technical advantage of the present invention is that it is able to sink or source a large output current even though it is biased at a low quiescent current to reduce power consumption by the amplifier. This increases the power efficiency of the amplifier especially at light loads and makes the amplifier compatible with the requirements of modern micropower applications.

Another technical advantage of the present invention is that an output stage constructed according to the teachings of the present invention can be configured so as to operate from a single power supply and can still swing within approximately one volt of the supply and can swing very near to ground potential. The output swing is thus superior to the conventional class B implementations.

Another technical advantage of the present invention is that an output stage constructed according to the teachings of the present invention can, be configured so that the signal path is propagated solely through NPN devices to achieve a wide bandwidth without requiring the use of high-frequency PNP devices. Such PNP devices are not compatible with many integrated circuit technologies.

Another technical advantage of the present invention is that in one embodiment the range of the output voltage of an amplifier circuit constructed according to the teachings of the present invention may extend from a value substantially equal to the power supply of the output stage of the amplifier to approximately a ground potential. The amplifier circuit may achieve this advantage by using two different power supplies. The first power supply provides a reduced voltage level to the sourcing and sinking circuits. The second power supply provides a higher voltage to the current source and mirroring circuit. The output voltage range of the sinking and sourcing circuits is substantially equal to the first voltage supply. Since nearly all current consumed by the amplifier at higher load currents is drawn from the first supply, the power efficiency for a given output swing is increased.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF THE INVENTION

Figure 1:
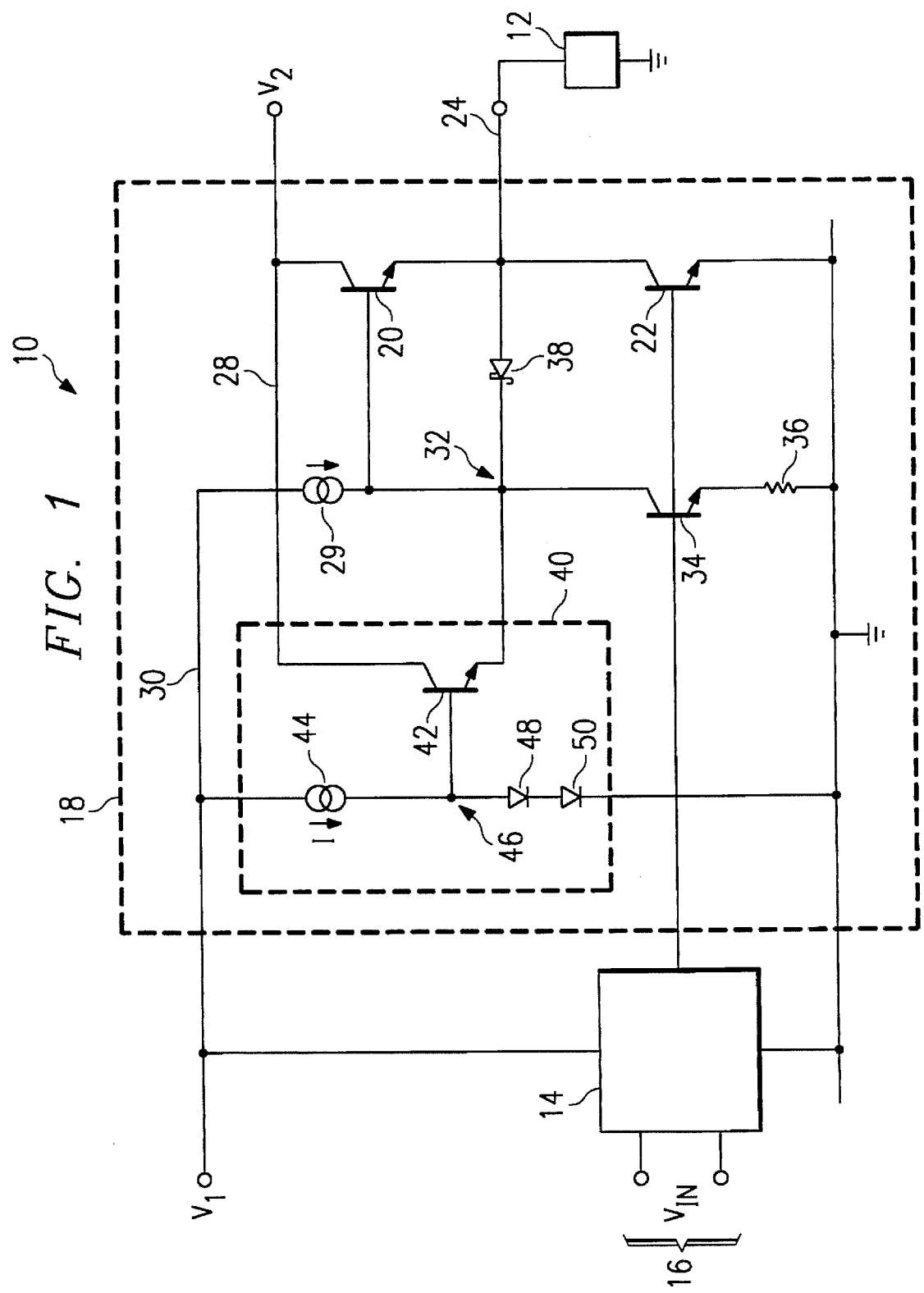
FIG. 1 is circuit schematic illustrating an embodiment of an amplifier circuit constructed according to the teachings of the present invention.

FIG. 1 is a circuit schematic illustrating an embodiment of an operational amplifier circuit indicated generally at 10 and constructed according to the teachings of the present invention. Amplifier 10 may operate to source or sink an output current to load 12. Amplifier 10 also operates at a low quiescent current compared to the maximum current amplifier 10 can source or sink. Amplifier 10 outputs a voltage to load 12 that is in the range from approximately the value of a power supply voltage down to a ground potential.

Amplifier 10 comprises an amplifier stage 14. Amplifier stage 14 may comprise any one of a number of conventional input and gain stages that provide an appropriately large gain. An input voltage is coupled to input terminals 16 of amplifier stage 14. Amplifier 10 also comprises an output stage 18 coupled to amplifier stage 14.

Figure 2:
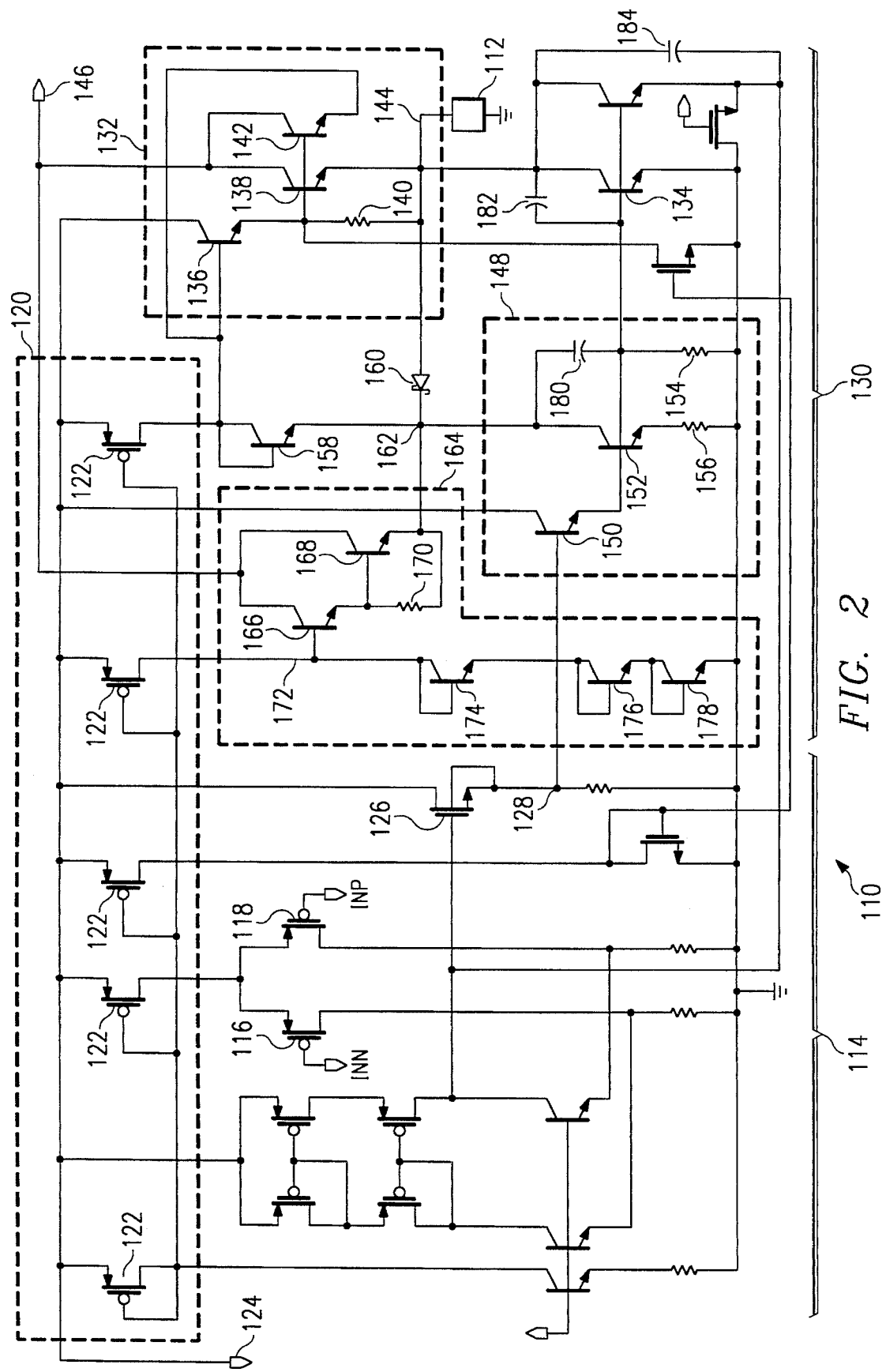
FIG. 2 is a circuit schematic illustrating another embodiment of an amplifier circuit constructed according to the teachings of the present invention.

Output stage 18 sources current to and sinks current from load 12. Output stage 18 comprises a sourcing transistor 20 and a sinking transistor 22. As shown, transistor 20 comprises a single NPN bipolar junction transistor. Transistor 20 may be replaced by a pair of transistors coupled in a Darlington pair as shown in FIG. 2 or any other appropriate circuit for providing an output current to load circuit 12. Transistor 22 comprises an NPN bipolar junction transistor. The collector of transistor 22 is coupled to the emitter of transistor 20 at an output node 24. The collector of transistor 20 is coupled to a first power supply rail 28. The emitter of transistor 22 is coupled to a ground potential. Transistor 20 is controlled by a current source 29. Current source 29 is coupled between a second power supply rail 30 and the base of transistor 20 at a node 32. Current source 29 may comprise, for example, an appropriately biased current mirror or any other appropriate source of current.

Output stage 18 is operable to sink or source a large current due to the combination of transistors 20 and 22, current source 29 and a mirror transistor 34. The collector of transistor 34 is coupled to current source 29 at node 32. The base of transistor 34 is coupled to an output of amplifier stage 14 and the base of transistor 22. The emitter of transistor 34 is coupled through a resistor 36 to a ground potential. Resistor 36 is chosen to control the rate at which the current in transistor 34 increases during a sinking operation.

Transistor 34 may assist transistor 22 in sinking a current from load 12. A diode 38 is coupled between output node 24 and node 32. Diode 38 conducts current from output node 24 to transistor 34 at node 32 when the voltage at node 32 is less than the voltage at node 24 by approximately one diode drop. Diode 38 may comprise, for example, an appropriate Schottky diode. Diode 38 also has the added benefit of protecting the base-emitter junction of transistor 20 from avalanche-induced beta degradation.

A clamp circuit 40 is coupled to node 32 to prevent transistor 34 from saturating and thus reducing the base current to transistor 22. Clamp 40 comprises a transistor 42. A collector of transistor 42 is coupled to power supply rail 28. An emitter of transistor 42 is coupled to node 32. A base of transistor 42 is coupled to a current source 44 at a node 46. Current source 44 is coupled to power supply rail 30. First and second diodes 48 and 50 are coupled between node 46 and a ground potential. Diodes 48 and 50 may comprise diode coupled transistors or any other appropriate diode for establishing a voltage at node 46.

In operation, amplifier 10 amplifies an input signal at input terminals 16 to produce an output signal for load 12 at node 24. Output stage 18 may either source current to load 12 or sink current from load 12. In sourcing current to load 12, the output of amplifier stage 14 is brought to a low potential voltage. This causes transistors 22 and 34 to conduct an insignificant amount of current. This is referred to as the "off" state of transistors 22 and 34. It is noted that transistors 22 and 34 are coupled such that the emitter current of transistor 34 is approximately mirrored or replicated in transistor 22 at low current levels. Because transistor 34 is turned off, the output of current source 29 is diverted into the base of transistor 20. Thereby, output stage 18 operates to produce an output current to load 12 at node 24 and the voltage at node 24 rises. The voltage at node 24 may rise to be approximately equal to the voltage at power supply rail 28 limited only by the saturation voltage of transistor 20. In order for the full output swing to be available, the voltage at power supply rail 30 must exceed the voltage at power supply 28 by an amount sufficient to establish the base-emitter voltage of transistor 20 and to provide adequate headroom for current source 29 to operate. For example, power supply rail 28 may comprise a 3 volt source and power supply rail 30 may comprise a 5 volt source. Use of the dual power supplies reduces the power dissipation by output stage 18 thereby increasing the efficiency of amplifier 10. Alternatively, power supply rails 28 and 30 may be coupled to a common voltage source. In this configuration, the output voltage may swing within approximately one volt of the power supply voltage due to the voltage drop across the base-emitter junction of transistor 20 and voltage requirements of current source 29.

Output stage 18 may also act as a current sink for load 12. To act as a sink, the output voltage of amplifier stage 14 causes transistor 34 to conduct current between its collector and emitter. This is referred to as the "on" state of the transistor. The current through transistor 34 is mirrored in transistor 22, at least at lower current levels where the voltage drop across resistor 36 is negligible. It is noted that the size of transistors 34 and 22 may be scaled such that the current in transistor 22 is related to the current in transistor 34 by a selected ratio. Transistor 34 absorbs current from current source 29 thus reducing the voltage at node 32 and turning off transistor 20. The voltage at node 32 continues to drop, and diode 38 conducts current from node 24 to node 32 while the output voltage at node 24 is greater than the voltage at node 32 by approximately a diode voltage drop across diode 38. In this manner, diode 38 diverts current to transistor 34 such that transistor 34 assists transistor 22 in sinking current from load 12. This prevents the collector current of transistor 34, not required to oppose current source 29, from being wasted, thus improving the efficiency of amplifier 10.

Clamping circuit 40 prevents the voltage at node 32 from dropping to a voltage that would allow transistor 34 to enter into saturation. During the sinking operation, the voltage at node 24 tends to decrease toward a ground potential. The voltage at node 32 also decreases along with the voltage at node 24 so long as current is conducted through diode 38. Clamp 40 prevents the voltage at node 32 from decreasing to a point that transistor 34 enters saturation. The voltage at node 46 is approximately two diode drops above ground potential. Therefore, transistor 42 begins to conduct current at its emitter when the voltage at node 32 reaches one diode voltage drop above ground potential. This establishes a lower limit to the voltage at node 32 and prevents transistor 34 from saturating. When clamp 40 begins to conduct, the voltage drop across diode 38 decreases and thus diode 38 begins to turn off.

Resistor 36 controls the rate at which current increases in transistor 34. At low currents, the emitter current of transistor 34 is approximately equal to the emitter current of transistor 22 assuming that the emitter areas of transistors 22 and 34 are scaled in a one to one relationship. At high current, resistor 36 prevents the emitter current in transistor 34 from linearly increasing with the emitter current in transistor 22. This allows output stage 18 to operate at a lower bias current when it is sinking current and the voltage at node 24 is low, forcing clamp 40 to conduct.

Output stage 18 of amplifier 10 is configured to provide at least two additional advantages. First, output stage 18 may be biased at a low quiescent current relative to its maximum output current. This reduces power consumption and increases the efficiency of amplifier 10 such that amplifier 10 is compatible with the requirements of modern micropower applications. Additionally, output stage 18 uses NPN transistors in its signal path to achieve a wide bandwidth.

FIG. 2 is a circuit schematic illustrating another embodiment of an operational amplifier circuit indicated generally at 110 and constructed according to the teachings of the present invention. Assuming worst case NPN betas of approximately 30 and a bias current of 50 microamps feeding the base of transistor 136, amplifier 110 may source or sink a current on the order of 25 to 30 milliamps from or to a load 112. Amplifier 110 also operates at a low quiescent current compared to the maximum current amplifier 110 can sink. Amplifier 110 outputs a voltage to load 112 that is in the range from approximately the value of the power supply 146 down to a ground potential.

Amplifier 110 comprises an amplifier stage 114. Amplifier stage 114 may comprise any one of a number of conventional input and gain stages that provide an appropriately large gain. As shown, amplifier stage 114 comprises a BiCMOS folded cascode amplifier stage. An input voltage is coupled to input transistors 116 and 118 of amplifier stage 114. Transistors 116 and 118 comprise PMOS transistors coupled in a conventional differential pair configuration. Amplifier 110 also comprises a current mirror 120 comprising a plurality of PMOS transistors 122. Current mirror 120 provides current for the operation of amplifier 110. Current source 120 is coupled to a first power supply 124. Amplifier stage 114 includes an output transistor 126. Amplifier stage 114 provides an output at the source of transistor 126 at node 128. Node 128 is coupled to an output stage 130 of amplifier 110.

Output stage 130 sources current to and sinks current from load 112. Output stage 130 comprises a sourcing circuit 132 and a sinking transistor 134. As shown, sourcing circuit 132 comprises first and second NPN bipolar junction transistors 136 and 138, respectively. Transistors 136 and 138 are coupled to form a Darlington pair with base turn-off resistor 140. By properly sizing resistor 140, crossover distortion in the amplifier can be minimized. Sourcing circuit 132 also comprises an anti-saturation transistor 142. A base of transistor 142 is coupled to a base of transistor 138. Additionally, an emitter of transistor 142 is coupled to a base of transistor 136. Finally, a collector of transistor 142 is coupled to a collector of transistor 138. The output of sourcing circuit 132 comprises the emitter of transistor 138 at node 144. The collector of transistor 138 is coupled to a second power supply 146. The collector of transistor 136 is coupled to first power supply 124. A collector of sinking transistor 134 is coupled to output node 144. Additionally, an emitter of transistor 134 is coupled to a ground potential.

A base of transistor 136 is coupled to current source 120. Output stage 130 is operable to sink or source a large current on the order of 25 to 30 milliamps due to the combination of sourcing circuit 132, sinking circuit 134, current source 120, and a mirror circuit 148. Mirror circuit 148 comprises first and second NPN bipolar junction transistors 150 and 152 coupled to form a Darlington pair with a base turn-off resistor 154. A base of transistor 150 is coupled to node 128 at the output of amplifier stage 114. The collector of transistor 150 is coupled to power supply 124. An emitter of transistor 150 is coupled a base of transistor 152. An emitter of transistor 152 is coupled through a resistor 156 to a ground potential. A collector of transistor 152 is coupled to current source 120 through a diode coupled transistor 158. Resistor 156 is chosen to control the rate at which the current in mirror circuit 148 increases during a sinking operation.

Mirror circuit 148 may assist transistor 134 in sinking a current from load 112. A diode 160 is coupled between output node 144 and node 162. Diode 160 conducts current from output node 144 to mirror circuit 148 at node 162 when the voltage at node 162 is less than the voltage at node 144 by approximately one diode voltage drop. Diode 160 may comprise, for example, an appropriate Schottky diode. Diode 160 also has the added benefit of protecting the base-emitter junctions of transistors 136 and 138 from avalanche-induced beta degradation.

A clamp circuit 164 is coupled to node 162 to prevent transistor 152 of mirror circuit 148 from saturating and reducing the base current to transistor 134. Clamp 164 comprises first and second NPN bipolar junction transistors 166 and 168 coupled in a Darlington pair with a base turn-off resistor 170. A collector of transistors 166 and 168 is coupled to power supply rail 146. An emitter of transistor 168 is coupled to node 162. A base of transistor 166 is coupled to current source 120 at node 172. First, second, and third diode connected NPN bipolar junction transistors 174, 176 and 178, respectively, are coupled between node 172 and a ground potential.

Amplifier 110 also comprises additional compensation circuitry. For example, mirror circuit 148 comprises a capacitor 180 coupled between a collector and a base of transistor 152 to Miller-compensate a minor loop comprising transistor 152. Similarly, capacitor 182 is coupled between a collector and a base of transistor 134 to aid in compensation. Finally, a capacitor 184 is coupled between output node 144 and amplifier stage 114.

In operation, amplifier 110 amplifies an input signal at input transistors 116 and 118 to produce an output signal for load 112 at node 144. Output stage 130 may either source current to load 112 or sink current from load 112. In sourcing current to load 112, the output of amplifier stage 114 is brought to a low potential voltage at node 128. This causes transistors 150, 152, and 134 to conduct an insignificant amount of current. This is referred to as the "off" state of transistors 150, 152, and 134. It is noted that transistors 150, 152, and 134 are coupled such that the emitter current of transistor 152 is approximately mirrored or replicated in transistor 134 at low current levels. Because transistor 150 is turned off, the output of current source 120 at transistor 158 is diverted into the base of transistor 136 of sourcing circuit 132. Thereby, output stage 130 operates to produce an output current to load 112 at node 144 and the voltage at node 144 rises. The voltage at node 144 may rise to be approximately equal to the voltage at power supply rail 146, as it is limited only by the saturation voltage of transistor 138. In order for the full output swing to be available, the voltage at power supply rail 146 must exceed the voltage at power supply rail 124 by an amount sufficient to establish the base-emitter voltage of transistors 136 and 138 and to provide adequate headroom for current source 120 to operate. For example, power supply rail 146 may comprise a 3 volt source and power supply rail 124 may comprise a 5 volt source. Use of the dual power supplies also reduces the power dissipation by output stage 130 thereby increasing the efficiency of amplifier 110. Alternatively, power supply rails 146 and 124 may be coupled to a common voltage source. In this configuration, the output voltage may swing within approximately two volts of the power supply voltage due to the voltage drop across the base-emitter junctions of transistors 136 and 138 and the voltage requirements of current source 120.

Output stage 130 may also act as a current sink for load 112. To act as a sink, the output voltage of amplifier stage 114 causes transistor 152 to conduct current between its collector and emitter. This is referred to as the "on" state of the transistor. The current through transistor 152 is mirrored in transistor 134, at least at lower current levels where the voltage drop across resistor 156 is negligible. It is noted that the size of transistors 152 and 134 may be scaled such that the current in transistor 134 is related to the current in transistor 152 by a selected ratio. Transistor 152 absorbs current from current source 120 through transistor 158 thus reducing the voltage at the base of transistor 136 and turning off transistors 136 and 138. The voltage at node 162 continues to drop, and diode 160 conducts current from node 144 to node 162 while the output voltage at node 144 is greater than the voltage at node 162 by approximately a diode voltage drop across diode 160. In this manner, diode 160 diverts current to transistor 152 such that transistor 152 assists transistor 134 in sinking current from load 112. This prevents the collector current of transistor 152 from being wasted, thus improving the efficiency of amplifier 110.

Clamping circuit 164 prevents the voltage at node 162 from dropping to a voltage that would allow transistor 152 to enter into saturation. During the sinking operation, the voltage at node 144 tends to decrease toward a ground potential. The voltage at node 162 also decreases along with the voltage at node 144 so long as current is conducted through diode 160. Clamp 164 prevents the voltage at node 162 from decreasing below one diode drop above ground thus preventing transistor 152 from saturating. The voltage at node 172 is approximately three diode drops above ground potential. Therefore, transistors 166 and 168 begin to conduct current when the voltage at node 162 reaches one diode voltage drop above ground potential. This establishes a lower limit on the voltage at node 162 and prevents transistor 152 from saturating. When clamp 164 begins to conduct, diode 160 loses forward bias and begins to turn off.

Resistor 156 controls the rate at which current increases in transistor 152. At low currents, the emitter current of transistor 152 is approximately equal to the emitter current of transistor 134 assuming that the emitter areas of transistors 134 and 152 are scaled in a one to one relationship. At high current, resistor 156 prevents the emitter current in transistor 152 from increasing at the same rate as the emitter current in transistor 134. This also allows output stage 130 to operate at a lower bias current when it is sinking current and the voltage at node 144 is low, forcing clamp 164 to conduct.

Although the present invention has been described in detail, it should be understood that various changes, substitutions and alterations can be made hereto without departing from the spirit and scope of the invention as defined by the appended claims. For example various NPN and PMOS transistors in FIGS. 1 and 2 may be changed to be PNP and NMOS transistors, respectively. The polarity of circuits 10 and 110 may thus be changed to provide amplifiers with a negative voltage output.

What is claimed is:

1. An output stage of an amplifier circuit also having an input amplifier stage, said output stage comprising:

circuitry operable to source an output current to an external load;

circuitry coupled to said sourcing circuitry and operable to sink current from the external load, said sourcing circuitry and said sinking circuitry having a common output node;

circuitry coupled to said sinking circuitry and operable to mirror the current in said sinking circuitry, said mirroring circuity controlled by an output of said input amplifier stage;

a current source coupled to provide current to both said mirroring circuitry and said sourcing circuitry;

a voltage clamp circuit coupled to said mirroring circuitry for establishing a predetermined lower voltage limit for said mirroring circuitry to prevent said mirroring circuitry from interfering with said sinking circuitry during a sinking operation;

said mirroring circuitry operable to draw current from said current source away from said sourcing circuitry when said sinking circuitry sinks current from the external load in response to a first predetermined output of said input amplifier stage; and said mirroring circuitry operable to cause said current source to provide current to said sourcing circuitry such that said sourcing circuitry provides current to the external load in response to a second predetermined output of said input amplifier stage.

2. The output stage of claim 1, wherein said sinking circuitry and said sourcing circuitry each comprise NPN bipolar junction transistors.

3. The output stage of claim 1, wherein said sourcing circuitry comprises first and second NPN bipolar junction transistors coupled to form a Darlington pair.

4. The output stage of claim 1, and further comprising a diode coupled between said common node and said mirroring circuitry for diverting current from said sinking circuitry to said mirroring circuitry during a sink operation.

5. The output stage of claim 1, wherein said mirroring circuitry comprises an NPN bipolar junction transistor having a resistor coupled between an emitter of said transistor and a ground potential, said resistor operable to control the rate of increase of current through said mirroring circuitry as said output stage performs a sinking operation.

6. The output stage of claim 1, and further comprising:
a diode coupled between said common node and said mirroring circuitry for diverting current from said sinking circuitry to said mirroring circuitry during a sink operation.

7. The output stage of claim 1, wherein said mirroring circuitry comprises an NPN bipolar junction transistor, said output stage further comprising:
a diode coupled between said common node and said mirroring circuitry for diverting current from said sinking circuitry to said mirroring circuitry during a sink operation;
a resistor coupled between an emitter of said transistor of said mirroring circuitry and a ground potential, said resistor operable to control the rate of increase of current through said mirroring circuitry.

8. The output stage of claim 1, wherein said voltage clamp circuit comprises:
first and second diodes coupled in series between a current source and ground; and
an NPN bipolar junction transistor having a base coupled to an output of said current source and an emitter coupled to said mirroring circuitry.

9. The output stage of claim 1, wherein said voltage clamp circuit comprises:
first, second and third diodes coupled in series between a current source and ground; and
a Darlington pair of NPN bipolar junction transistors having a base coupled to an output of said current source and an emitter coupled to said mirroring circuitry.

10. The output stage of claim 1, wherein said mirroring circuitry comprises first and second NPN bipolar junction transistors coupled to form a Darlington pair.

11. The output stage of claim 1, and further comprising:
a first voltage source for providing power to said sourcing and sinking circuits; and
a second voltage source, different from said first voltage source, for providing power to said current source and mirroring circuitry such that the output voltage swing of the output stage is approximately equal to the voltage of said first voltage source.

12. An amplifier circuit, comprising:
an input amplifier stage having an output;
a first bipolar junction transistor for sourcing current to an external load;
a second bipolar junction transistor for sinking current from the external load, an emitter of said first transistor coupled to a collector of said second transistor to form a common output node;
a third bipolar junction transistor having a base coupled to a base of said second transistor such that current in said second transistor approximately mirrors current in said third transistor during a sinking operation;
a current source coupled to a base of said first transistor and a collector of said third transistor;
a voltage clamp circuit coupled to said third bipolar transistor for establishing a predetermined lower voltage limit to prevent said third bipolar transistor from interfering with said second transistor during a sinking operation;
said third transistor operable to draw current from said current source away from said first transistor to when said second transistor sinks current from the external load in response to a first predetermined output of said amplifier stage; and
said third transistor operable to cause said current source to provide current to said first transistor such that said first transistor provides current to the external load in response to a second predetermined output of said amplifier stage.

13. The amplifier circuit of claim 12, and further comprising a diode coupled between said common output node and said collector of said third transistor for diverting current from said second transistor to said third transistor during a sink operation.

14. The amplifier circuit of claim 12, and further comprising:
a diode coupled between said common output node and said third transistor for diverting current from said second transistor to said third transistor during a sink operation; and
a resistor coupled between an emitter of said third transistor and a ground potential, said resistor operable to control the rate of increase of current through said third transistor.

15. The amplifier circuit of claim 12, wherein said voltage clamp circuit comprises:
first and second diodes coupled in series between a current source and a ground potential; and
an NPN bipolar junction transistor having a base coupled to an output of said current source and an emitter coupled to said collector of said third transistor.

16. The amplifier circuit of claim 12, wherein said first and third transistors each comprise Darlington pairs.

17. The amplifier circuit of claim 12, and further comprising:
a first voltage source for providing power to said first and second transistors; and
a second voltage source, different from said first voltage source, for providing power to said current source and said third transistor such that the output voltage swing of the amplifier circuit is approximately equal to the voltage of said first voltage source.

18. The amplifier circuit of claim 12, and further comprising:
a diode coupled between said common output node and said collector of said third transistor for diverting current from said second transistor to said third transistor during a sink operation.

19. A method for controlling an output current of an amplifier circuit having sourcing and sinking circuits coupled with a common output node, said method comprising the steps of:
generating a control output signal in an amplifier stage of the amplifier circuit in response to an input to the amplifier circuit;

providing the control signal to a mirror circuit that mirrors the current in the sinking circuit;

establishing a predetermined voltage at a collector of a transistor of the mirror circuit with a voltage clamp;

drawing current from a current source of the amplifier circuit away from the sourcing circuit to the mirror circuit in response to a first predetermined control signal such that the amplifier sinks a current from an external load; and providing current from the current source to the sourcing circuit in response to a second predetermined control signal such that the amplifier sources current to the external load.

20. The method of claim 19, and further comprising the steps of:

diverting current from the sinking circuit to the mirror circuit during a sinking operation with a diode coupled between the output node and the mirror circuit; and limiting the high current range of the transistor of the mirror circuit by a resistor coupled to the emitter of the transistor such that the transistor does not saturate during a sinking operation and divert current from the sinking circuit.

* * * * *